United States Patent [19]

Zavracky et al.

[11] Patent Number: 5,120,509
[45] Date of Patent: Jun. 9, 1992

[54] METHOD AND APPARATUS FOR REDUCING DEFECTS IN SOI STRUCTURES

[75] Inventors: Paul M. Zavracky, Norwood; Thomas P. Ford, Hopedale; Lisa P. Allen, Norton, all of Mass.

[73] Assignee: Kopin Corporation, Taunton, Mass.

[21] Appl. No.: 608,559

[22] Filed: Nov. 2, 1990

[51] Int. Cl.$^5$ ............................................. C30B 13/00
[52] U.S. Cl. ................................... 422/248; 156/603; 156/620.71; 156/620.73; 156/DIG. 64; 156/DIG. 73; 156/DIG. 75; 156/DIG. 76; 219/535; 219/536; 422/250
[58] Field of Search .............. 156/603, 620.71, 620.73, 156/DIG. 64, DIG. 73, DIG. 75, DIG. 76; 422/248, 250; 219/535, 536

[56] References Cited

U.S. PATENT DOCUMENTS

| | | | |
|---|---|---|---|
| 2,719,799 | 10/1955 | Christian | 148/1 |
| 3,433,627 | 3/1969 | Shou Chu Liang et al. | 75/65 |
| 3,984,280 | 10/1976 | Besselere et al. | 156/609 |
| 4,068,814 | 1/1978 | Anthony et al. | 248/176 |
| 4,086,424 | 4/1978 | Mellen, Sr. | 13/24 |
| 4,097,226 | 6/1978 | Erikson et al. | 432/120 |
| 4,135,027 | 1/1979 | Anthony et al. | 428/195 |
| 4,196,042 | 4/1980 | Rennolds | 156/616 |
| 4,371,421 | 2/1983 | Fan et al. | 156/624 |
| 4,444,620 | 4/1984 | Kovacs et al. | 156/620.71 |
| 4,479,846 | 10/1984 | Smith et al. | 156/612 |
| 4,576,676 | 3/1986 | Smith et al. | 156/620.71 |
| 4,578,143 | 3/1986 | Arai | 156/617 |
| 4,694,143 | 9/1987 | Nishimura et al. | 219/388 |
| 4,880,962 | 11/1989 | Nolf et al. | 219/549 |
| 4,944,835 | 7/1990 | Allen et al. | 156/620.71 |

OTHER PUBLICATIONS

Geis, et al., *J. Electrochem. Soc:* Solid-State Science & Technology, 129(12): 2812-2818 (1982).
Fan, et al., *Applied Physics Letters*, 41(2): 186-188 (Jul. 1982).
"Transient Heating with Graphite Heaters for Semi Conductor Processing", Lincoln Laboratory, MIT, (1982), 751-758.
"Effects of heating-temperature gradient and scanning direction on crystallographic properties of zone-melting recrystallized silicon on square shaped fused quartz", Dept. of Electrical Engineering, Kyoto, Japan, (1984) pp. 2986-2988.

*Primary Examiner*—Robert Kunemund
*Assistant Examiner*—Felisa Garrett
*Attorney, Agent, or Firm*—Hamilton, Brook, Smith & Reynolds

[57] ABSTRACT

A method and apparatus for reducing branching, reducing defects, and improving the overall surface morphology of silicon on insulator (SOI) structures produced by Zone Melting and Recrystallization (ZMR) is described. A special heater for use in preparing SOI structures formed by ZMR comprises a graphite mass having corrugations extending along one or more side walls and which may be periodic. The heater provides concentrated regions of heat which vary periodically across the length of the molten zone of the SOI structure. Alternatively, the heater comprises a stationary lower heater member upon which the wafer is placed and a movable upper heater member having corrugations. ZMR is achieved by translating the corrugated upper heater member past the wafer. In yet another alternative, a well known strip heater having a uniformly shaped movable upper member is improved by replacing the upper member with a movable upper heater member having corrugations.

17 Claims, 2 Drawing Sheets

PRIOR ART SUBBOUNDARY PATTERN

IMPROVED SUBBOUNDARIES

METHOD AND APPARATUS FOR REDUCING DEFECTS IN SOI STRUCTURES

BACKGROUND

Silicon on insulator (SOI) technology is a recent approach to providing single crystal silicon on insulating structures. Several methods for making SOI structures are presently available. One successful approach has been to cover a silicon wafer with a layer of an insulating material such as silicon nitride or silicon dioxide, and then to deposit silicon by chemical vapor deposition (CVD) on the insulator to form a polysilicon layer. Next, the polysilicon layer is formed into a single crystal layer by a number of techniques such as Zone Melting and Recrystallization (ZMR).

In one version of ZMR, the polysilicon is seeded by the single crystal silicon substrate whereby seed openings are etched or scribed down to the substrate. A movable strip heater is positioned above the openings and melts the polysilicon through to the subsrate forming a molten zone. The heater is then moved laterally creating a translating molten zone, and single crystal silicon is grown laterally over the wafer as the melted polysilicon recrystallizes due to the molten zone tranlsating along the wafer. An optional encapsulation layer may be formed over the polysilicon film to improve thermal stability of the molten zone and to prevent contamination of the film.

Several problems have been found with the previously described process. The liquid/solid front for recrystallization by the graphite strip heater forms a favorable energy configuration of a faceted front of (111) planes as it advances across the wafer. Thus, the liquid/-solid interface morphology and the resulting defect structure and density of the finished SOI product is quite sensitive to small changes in the power applied to the heater or the height of the upper strip heater. If the power, or height, of the strip heater is not favorable, the surface morphology of the resulting crystal suffers from branching of the defect trails or even multigrained growth. These morphologies are not conductive to optimal performance of devices formed in the SOI structure. Additionally, the presence of these defects causes a thickness variation of the recrystallized layer. Elimination of branching, reduction of the defects and thickness variation, and overall improvement of surface morphology would significantly improve the yield and quality of this SOI process.

A method of entraining crystalline defects is presented in U.S. Pat. No. 4,479,846 to Smith et al. As stated in the patent, an added step is required before ZMR processing of the polysilicon on insulator on silicon substrate can be initiated. A layer of material in the form of a pattern of parallel stripes must be added to the substrate. The addition of this pattern of stripes, known as the entrainment pattern, is required carry out the method and contributes additional time, effort and complexity to the process.

Once the entrainment pattern is added to the structure, the Smith invention uses a traditional strip heater which is passed over the structure creating a translating molten zone in the polysilicon. The Smith invention is directed at defect entrainment by the application of an extra layer of material to the wafer before ZMR processing.

SUMMARY OF THE INVENTION

The present invention comprises a method and apparatus for reducing branching, reducing defects and improving the overall surface morphology of basic silicon on insulator (SOI) structures produced by the zone melting and recrystallization process. In one embodiment of the present invention, a special heater for use in the preparation of SOI structures formed by ZMR is provided. The heater comprises a graphite member with corrugations extending along one of its side walls. The corrugations consist of alternate ridges and grooves which preferably are periodic. The heater is generally in the form of a rectangular shaped cube or rod. The contour of these corrugations may comprise a v-shape, a u-shape or a slotted shape. The corrugations may be located on a side wall of the heater which is perpendicular to the direction of heater translation. Preferably the corrugations extend vertically along the side wall. Alternatively, the corrugations may be located on a side wall of the heater which is adjacent to the wafer and may extend parallel to the direction of translation. In yet another alternative, the heater may have corrugations on both of these side walls.

A heater employing any one of these options will provide concentrated regions of heat which vary across the length of the molten zone. These hot/less hot zones produced by the heater extensively suppress branching and defect density and significantly improve the surface morphology.

In a preferred embodiment of the present invention, the heater comprises a stationary lower heater member and a movable upper heater member having corrugations. A wafer is placed on the lower heater member, and zone melting and recrystallization is achieved by translating the corrugated upper heater member past the wafer. The upper heater member may be formed of graphite with corrugations located on one or more side walls, as described previously, producing periodically varying regions of heat concentrated across the molten zone of the wafer.

In yet another embodiment of this invention, a well known strip heater having a uniformly shaped movable upper member is improved by replacing the upper member with a movable upper heater member comprising a graphite mass having corrugations.

The above and other features of the invention including various novel details of construction will now be described with reference to the accompanying drawings and pointed out in the claims.

DETAILED DESCRIPTION OF THE INVENTION

Figure 1:
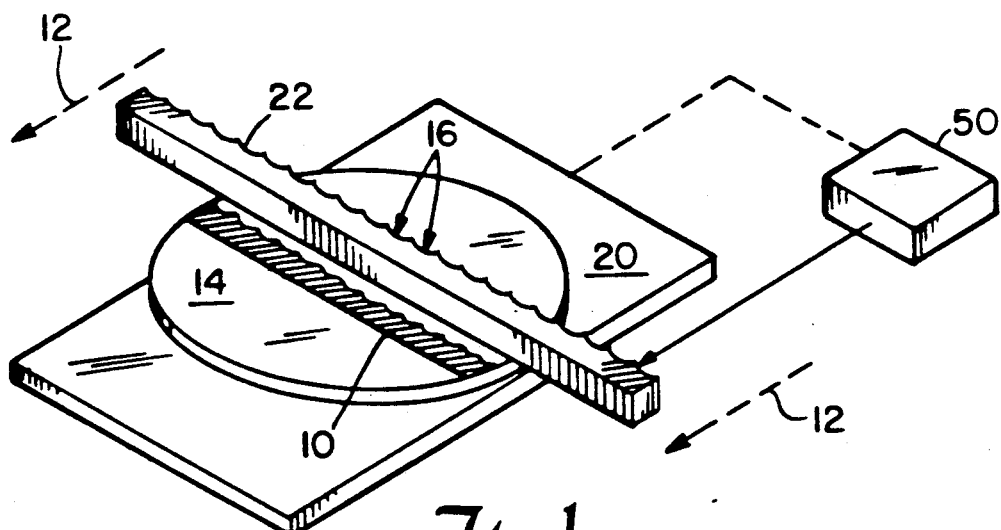
FIG. 1 is a perspective view of a zone melting and recrystallization apparatus in accordance with the invention.

Referring now to FIG. 1, a heater member 22 formed of graphite, or other suitable material is shown. Member 22 is used for Zone Melting and Recrystallization (ZMR) processing of polysilicon on insulator on silicon (SOI) wafer structures. The heater member 22 is energized by conventional heat control unit 50. In this ZMR process, a sample SOI structure 14 is situated on an inert base 20 which may serve as a heater and is subjected to thermal treatment by translating the movable heater 22 past the SOI structure in the direction of the arrows 12. A molten zone 10 is formed in the polysilicon film. As the movable heater 22 passes by the wafer, this molten zone is initially formed at the top right edge of the wafer and moves from right to left in the direction of the arrows 12. The epitaxial silicon wafer acts as a seed in the molten zone to recrystalize the polysilicon film producing the equivalent of homoepitaxial silicon. The heater may be shaped like a rectangular rod such that its length is greater than its width and height. The heater has corrugations 16 along one or more of its sides. The corrugations may be v-shaped, u-shaped or slotted shaped. These corrugations ensure that heat is distributed non-uniformly, and preferably periodically, across the length of the molten zone 10 of the wafer 14 as the heater is translated across the wafer. The branching and defect density of the resulting SOI structure is extensively suppressed, and the surface morphology is significantly improved by the alternate hot and less hot zones created by the corrugations of the heater 22.

Figure 2:
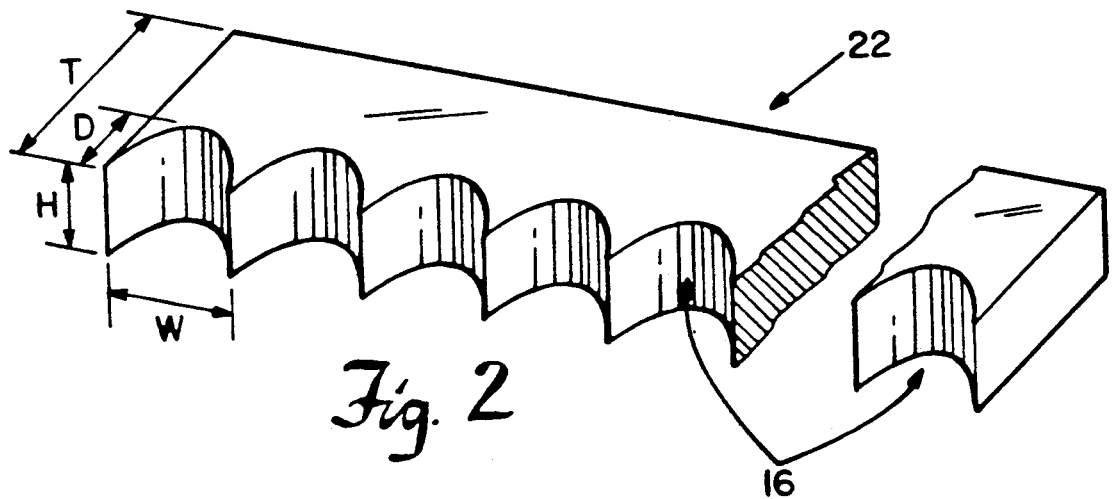
FIG. 2 is an enlarged perspective view of the heater member 22 of FIG. 1 illustrating vertical corrugations extending along a side of the heater which is perpendicular to the direction of heater translation.
Figure 3:
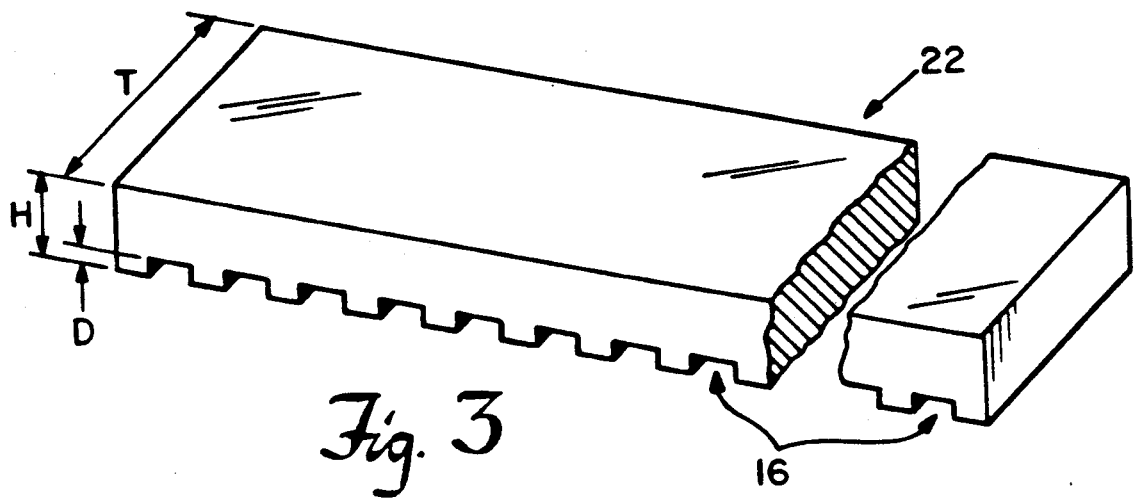
FIG. 3 is an enlarged perpective view of the heater member 22 of FIG. 1 illustrating corrugations extending in the direction of translation along a side of the heater adjacent to the wafer.
Figure 4:
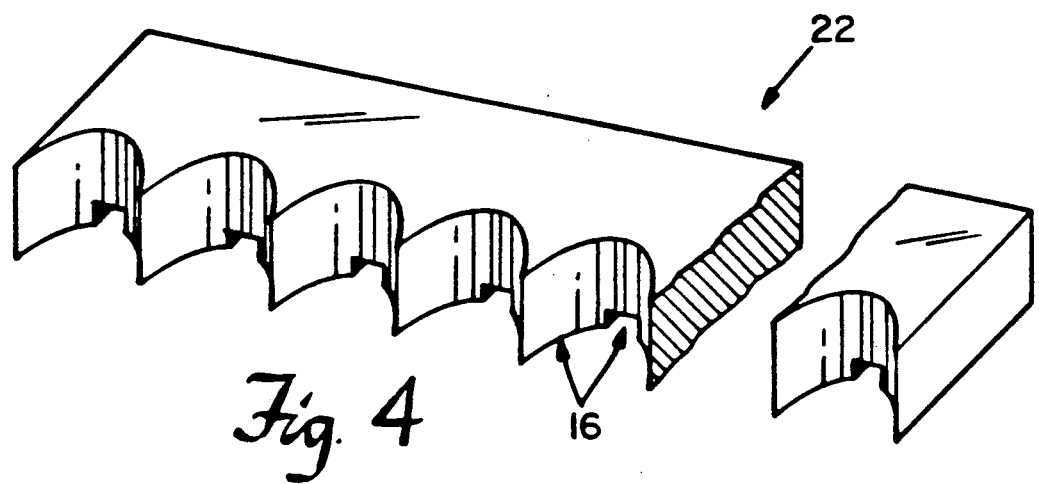
FIG. 4 is a perspective view illustrating a heater of the present invention wherein periodic corrugations are along two sides of the heater.

The heater 22 is equally effective in reducing branching in finished SOI structures while having corrugations of varying periodic or non-periodic shapes which may be oriented on one or more of its sides. In FIG. 2, the corrugations 16 have a u-shaped contour and are situated vertically along a side of the heater 22 which is perpendicular to the direction of translation 12. In FIG. 3, the heater 22 has slotted corrugations 16 along the side adjacent to the wafer (not shown) and parallel to the direction of translation 12. In FIG. 4, the heater 22 has corrugations 16 along two sides. One side of the heater which is perpendicular to the direction of translation 12 has u-shaped or v-shaped corrugations 16, and the side of the heater adjacent to the wafer has slotted shaped corrugations 16.

As a heater having corrugations according to FIG. 2, 3 or 4 is translated across a wafer, concentrated regions of heat are distributed periodically across the length of the molten zone 10 of the wafer 14.

Figure 5A:
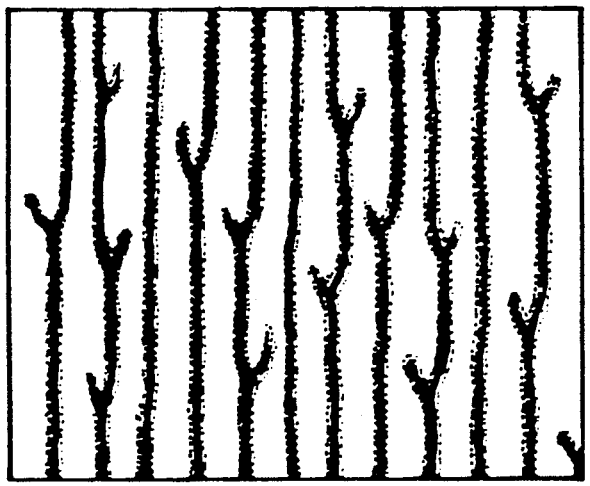
FIG. 5a,b are micrographs illustrating the branching and defect patterns produced by ZMR using (a) a traditional strip heater and (b) the present invention respectively.
Figure 5B:
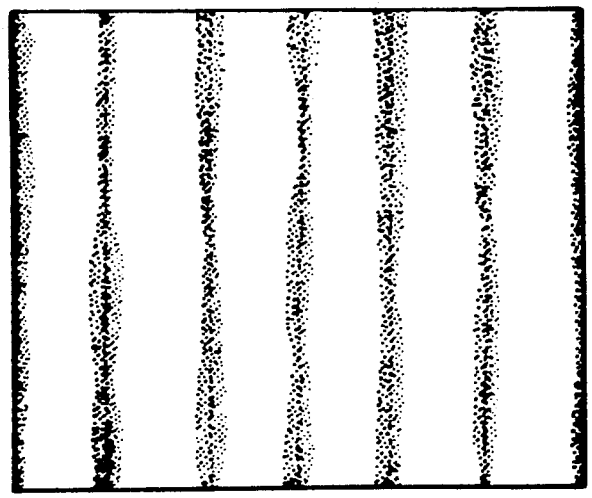

When the present invention is used in conjuction with ZMR processing on SOI structures, branching and defect density in the finished product are extensively suppressed and the surface morphology is significantly improved. This is in contrast to the well known uniformly shaped graphite strip heater which melts silicon uniformly across the molten zone of the wafer. The marked improvement in the branching pattern can be seen by a Nomarski optical microscopy pattern as shown in FIGS. 5a and 5b. The branching pattern of an SOI structure which was recrystallized using a traditional strip heater is illustrated in FIG. 5a, and the resulting pattern which would be obtained using the present invention is shown in FIG. 5b.

By using a heater having a novel shape which produces alternate regions of heat and less heat, the crystalline boundaries (or branching structure) of the recrystallized structure are aligned in parallel and are directed perpendicular to the heater. Furthermore, the spacing between the defect lines (i.e. the defect density) of a recrystallized SOI structure is reduced by the corrugations along one or more sides of the heater. Also, the presence of these defect lines results in a thickness variation of the recrystallized polysilicon layer, so reducing the defect density improves the surface morphology of the recrystallized layer.

In an alternative embodiment of the present invention, a strip heater comprises a stationary lower heater member and a movable upper heater member. Referring back to FIG. 1, the base 20 may be formed of material such as graphite and be connected as shown by dotted lines to heat control unit 50 to form a stationary lower heater. Movable upper heater 22 has corrugations according to FIG. 2, 3 or 4. The optimum dimensions for the movable upper heater 22 lie within ranges which vary depending upon the shape of the corrugations. For a movable upper heater having corrugations as shown in FIG. 2, we have found preferable dimensional ranges are as follows: the thickness T of the upper heater is 0.040–0.200 inches, the height H of the upper heater is 0.010–0.100 inches, the depth D of the corrugations is 0.003–0.010 inches and the width W of the corrugations is 0.010–0.032 inches. Alternatively, the preferable dimensional ranges for a movable upper heater having corrugations according to FIG. 3 are as follows: the thickness T of the upper heater is 0.040–0.200 inches, the height H of the upper heater is 0.010–0.100 inches and the depth D of the corrugations is 0.005–0.100 inches.

A polysilicon on insulator on silicon (SOI) wafer structure 14 is subject to a thermal treatment by being placed upon the stationary lower member 20, while the movable upper heater 22 is mechanically translated past the SOI structure in the direction of translation 12. As described previously a molten zone is created in the polysilicon film, and the molten zone is translated across the wafer as the heater is translated. Once again the finished SOI structure has a minimal branching pattern, reduced defect density, and an improved surface morphology.

While the invention has been particularly shown and described with reference to specific the preferred embodiments, it should be understood that those skilled in the art would be capable of devising various changes in form and detail without departing from the spirit and scope of the invention.

These and all other equivalents are intended to be encompassed by the following claims.

We claim:

1. A strip heater for use in a zone melting and re-crystallization process in which a polysilicon film formed over an insulator film over a silicon wafer is melted by translating a heater member past the wafer and wherein the melted polysilicon forms a molten zone which is translated across the wafer as the heater member is translated, the strip heater comprising a rigid walled heater member having a length L, height H, thickness T, the heater member comprising a graphite resistance heater through which current is passed to heat the member uniformly, and corrugations formed on said member and extending along the length thereof, forming concentrated regions of heat and less heat which vary across the length of the molten zone.

2. A strip heater as claimed in claim 1 wherein the heater member comprises a graphite mass in which the corrugations are formed on a side wall of the mass and extend along the length of the heater.

3. A strip heater as claimed in claim 2 wherein the corrugations are periodic.

4. A strip heater as claimed in claim 2 wherein the corrugations of the side wall are v-shaped.

5. A strip heater as claimed in claim 2 wherein the corrugations of the side wall are u-shaped.

6. A strip heater as claimed in claim 1 wherein the heater member comprises a graphite mass with two side walls and two face walls and the corrugations extend along the length of one of the face walls.

7. A strip heater as claimed in claim 6 wherein the corrugations are v-shaped.

8. A strip heater as claimed in claim 6 wherein the corrugations are u-shaped.

9. A strip heater for use in the preparation of silicon on insulator structures formed by seeded recrystallization of a polysilicon film over an insulator film over a silicon wafer wherein the polysilicon film is melted by translating an upper heater member past the wafer and the melted polysilicon forms a molten zone which is translated across the wafer as the upper heater member is translated, the strip heater comprising:
a stationary lower heater member upon which the wafer is placed; and
a movable upper heater member comprising a rigid graphite mass through which current is passed to heat the member uniformly, the mass having corrugations formed thereon to provide concentrated regions of heat which vary periodically from more to less heat across the length of the mass.

10. An improved strip heater for use in zone melting and recrystallization in which a polysilicon film over an insulator film over a silicon wafer is melted by translating a graphite rigid heater member, through which current is passed to heat the member uniformly, past the wafer and wherein the melted polysilicon forms a molten zone which is translated across the wafer as the heater member is translated, the member having corrugations extending along the length of one side wall of the heater member and which provide regions of heat varying periodically across the length of the molten zone.

11. An improved strip heater as claimed in claim 10 wherein the corrugations extend vertically along a side wall of the heater member having a direction which is perpendicular to the direction of translation.

12. An improved strip heater as claimed in claim 11 in which the heater member further comprises having corrugations extending horizontally in the direction of translation along a second side wall of the graphite mass, wherein the second side wall is adjacent to the wafer and parallel to the direction of translation.

13. A strip heater as claimed in claim 10 wherein the corrugations extend horizontally in the direction of translation along a side wall of the heater member, wherein the side wall is adjacent to the wafer and parallel to the direction of translation.

14. A strip heater for use in the preparation of silicon on insulator structures formed by recrystallization of a polysilicon film over an insulator film over a silicon wafer wherein the polysilicon film is melted by translating an upper heater member past the wafer and the melted polysilicon forms a molten zone which is translated across the wafer as the upper heater member is translated, the strip heater comprising:
a stationary lower heater member upon which the wafer is placed; and
a movable upper heater member comprising a rigid graphite mass through which current is passed to heat the member uniformly with corrugations extending along one side wall of the mass which provide concentrated regions of heat which vary across the length of the molten zone.

15. A strip heater as claimed in claim 14 wherein the corrugations extend vertically along a side wall of the movable upper heater member which is perpendicular to the direction of translation.

16. A strip heater as claimed in claim 15 wherein the movable upper heater member further comprises corrugations extending horizontally in the direction of translation along a second side wall which is adjacent to the wafer and parallel to the direction of translation.

17. A strip heater as claimed in claim 14 wherein the corrugations extend horizontally in the direction of translation along a side wall of the movable upper heater member which is adjacent to the wafer and parallel to the direction of translation.

* * * * *

UNITED STATES PATENT AND TRADEMARK OFFICE
CERTIFICATE OF CORRECTION

PATENT NO. : 5,120,509
DATED : Jun. 9, 1992
INVENTOR(S) : Lisa P. Allen, Thomas P. Ford, Paul M. Zavracky It is certified that error appears in the above-identified patent and that said Letters Patent is hereby corrected as shown below:

On the title page, Item [73]

Assignee: [75], delete names of inventors as listed and replace with ---Lisa P. Allen, Thomas P. Ford, Paul M. Zavracky---.

Signed and Sealed this

Third Day of August, 1993

Attest:

MICHAEL K. KIRK

*Attesting Officer*    *Acting Commissioner of Patents and Trademarks*